United States Patent
Walsh et al.

[11] Patent Number: 6,007,867
[45] Date of Patent: Dec. 28, 1999

[54] METHOD OF MANUFACTURING A THICK FILM CIRCUIT WITH IMPROVED DIELECTRIC FEATURE DEFINITION

[75] Inventors: James Edward Walsh, W. Lafayette; Carl William Berlin, West Lafayette; Frans Peter Lautzenhiser, Noblesville; John Karl Isenberg, Rossville, all of Ind.

[73] Assignee: Delco Electronics Corp., Kokomo, Ind.

[21] Appl. No.: 09/106,788

[22] Filed: Jun. 29, 1998

Related U.S. Application Data

[63] Continuation-in-part of application No. 08/991,685, Dec. 16, 1997, Pat. No. 5,910,334.
[51] Int. Cl.$^6$ ........................................................ B05D 5/12
[52] U.S. Cl. ............................ 427/96; 427/258; 427/384; 427/402; 29/840
[58] Field of Search .................................. 427/96, 372.2, 427/384, 379, 402, 258; 29/840

*Primary Examiner*—Brian K. Talbot
*Attorney, Agent, or Firm*—Jimmy L. Funke

[57] ABSTRACT

An improved method of manufacturing thick film circuits that effectively eliminates the trade-off between thickness and definition, permitting dielectric layers of increased thickness with no pin-holes, and at the same time, more precise definition of dielectric features, such as via openings and solder stops. The method utilizes a dielectric material that can be co-fired with an underlying conductor, and preferably, that remains porous after firing. A layer of the dielectric material (FDL) is printed atop a dried but not yet fired conductor of the first circuit layer, and then co-fired with the conductor. Spreading of the FDL prior to firing is minimized due to the porosity of the dried but unfired conductor, which absorbs solvent from the FDL. The FDL can be printed in a ring, enclosing a portion of the underlying conductor to form a via definition ring, or VDR. After the FDL and conductor have been co-fired, a relatively thick cover layer of conventional dielectric material is printed over the first circuit layer, partially over-lapping the fired VDR. Again, spreading of the cover layer of dielectric is minimized, this time due to the porosity of the fired VDR, which absorbs solvent from the cover layer dielectric. The cover layer dielectric is then fired, and a second cover layer of conventional dielectric is printed atop the first cover layer to achieve the desired overall dielectric thickness. Spreading of the second cover layer is also inhibited by the fired VDR, resulting in a via with greatly improved definition compared to previously known processes. Alternatively, the FDL can be printed atop a dried but un-fired conductor and then co-fired with the conductor to form a solder stop with significantly improved feature definition. As with the via, the improved definition occurs because the porous un-fired conductor inhibits spreading of the FDL.

9 Claims, 7 Drawing Sheets

METHOD OF MANUFACTURING A THICK FILM CIRCUIT WITH IMPROVED DIELECTRIC FEATURE DEFINITION

RELATED APPLICATION

This application is a continuation-in-part of U.S. patent application Ser. No. 08/991,685, filed Dec. 16, 1997 now U.S. Pat. No. 5,910,334, assigned to the assignee of the present invention, and entitled "Method of Manufacture for a Thick Film Multi-Layer Circuit".

FIELD OF THE INVENTION

This invention relates to the manufacturing thick film circuits, and more particularly to a method of making circuits having thick dielectric layers and precisely defined dielectric features.

BACKGROUND OF THE INVENTION

In the manufacture of multi-layer thick film circuits, successive layers of circuitry comprising conductors and components are electrically and physically isolated from one another by one or more intervening layers of dielectric material. To provide adequate isolation, the dielectric layer must be fairly thick, particularly where the top circuit layer includes components that are designed to be laser trimmed. Printing a thick dielectric layer is also desirable for process considerations, as thinner prints are prone to the formation of undesirable pin-holes, and such pin-holes are prone to propagate through successive layers of thin dielectric prints. However, thick layers of dielectric are problematic because they tend to spread beyond the intended print pattern, reducing the definition of dielectric features such as via openings and solder stops. Although dielectric formulations can be modified to reduce spreading, this also tends to produce pin-holes in the resulting dielectric layer. Consequently, circuit designers must contend with an engineering tradeoff between print thickness and feature definition. In a typical design compromise, the dielectric is printed at less than the desired thickness, the via openings are enlarged and the solder stops are pulled back to accommodate a certain amount of dielectric layer spreading. Increased dielectric thickness is then achieved by printing additional dielectric layers atop the initial dielectric layer. Obviously, this design approach is not particularly desirable, since extra large dielectric features limit circuit density on the upper dielectric layer, thin printing layers are prone to pin-holing, and extra printing and firing steps increase cost and reduce manufacturing throughput.

SUMMARY OF THE PRESENT INVENTION

The present invention is directed to an improved method of manufacturing thick film circuits that effectively eliminates the trade-off between thickness and definition, permitting dielectric layers of increased thickness with no pin-holes, and at the same time, more precise definition of dielectric features, such as via openings and solder stops.

The method of this invention utilizes a dielectric material that can be co-fired with an underlying conductor, and preferably, that remains porous after firing. A layer of the dielectric material, referred to herein as a feature definition layer (FDL), is printed atop a dried but not yet fired conductor of the first circuit layer, and then co-fired with the conductor. Spreading of the FDL prior to firing is minimized due to the porosity of the dried but unfired conductor, which absorbs solvent from the FDL.

In a first embodiment, the FDL can be printed in a ring, enclosing a portion of the underlying conductor to form a via definition ring, or VDR. After the FDL and conductor have been co-fired, a relatively thick cover layer of conventional dielectric material is printed over the first circuit layer, partially over-lapping the fired VDR. Again, spreading of the cover layer of dielectric is minimized, this time due to the porosity of the fired VDR, which absorbs solvent from the cover layer dielectric. The cover layer dielectric is then fired, and a second cover layer of conventional dielectric is printed atop the first cover layer to achieve the desired overall dielectric thickness. Spreading of the second cover layer is also inhibited by the fired VDR, resulting in a via with greatly improved definition compared to previously known processes. In applications where a layer of via fill material is needed to provide smoother surface topology, the second cover layer may be printed after the via fill material, preferably before firing of the via fill material in order to minimize spreading of the second cover layer.

When compared with conventional processes, a circuit manufactured according to the method of this invention has a thicker dielectric, and at the same time, smaller and better defined vias. The thicker dielectric layer provides improved isolation between circuit layers, as discussed above, and the smaller vias increase the available surface area for conductors and components on the upper dielectric layer.

In a second embodiment, the FDL can be printed atop a dried but un-fired conductor and then co-fired with the conductor to form a solder stop with significantly improved feature definition. As with the via, the improved definition occurs because the porous un-fired conductor inhibits spreading of the FDL. Since the solder stops may be precisely controlled, process variability is reduced, and reliability of the final product is increased.

In both embodiments, the method of this invention contributes to a more robust process that is well suited to high volume manufacturing since there is less fine tuning and batch-to-batch variation.

DETAILED DESCRIPTION OF THE DRAWINGS

Various approaches to forming dielectric features in a multi-layer thick film circuit are shown in FIGS. 1–7. In each case, the reference numeral 10 designates the surface 10 of a ceramic substrate, and the reference numeral 12 designates a thick film conductor forming a portion of a first circuit layer on the substrate surface 10. For convenience, the vertical scale in the cross-section diagrams of FIGS. 1–3 and 5–7 has been exaggerated by a factor of approximately two, compared to the horizontal scale.

FIGS. 1–2 and 4–6 depict various manufacturing processes for forming vias in a dielectric layer disposed intermediate the first circuit layer and a second circuit layer formed later in the manufacturing process. The dielectric layer provides mechanical and electrical isolation between the first and second circuit layers, and the vias are used to electrically interconnect the first and second circuit layers. In general, dielectric layers are formed by two or more successive printing steps to minimize the likelihood of a circuit defect due to processing flaws.

Figure 1A:
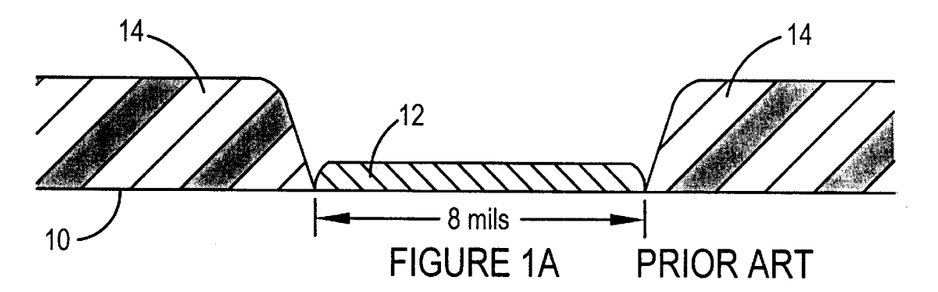
FIGS. 1A–1B depict in cross-section an ideal method of manufacturing a via in a thick film circuit.
Figure 1B:
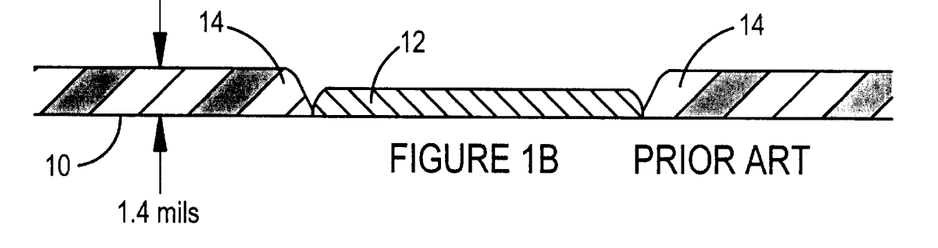

FIGS. 1A–1B depict the formation of a via under ideal process conditions with ideal materials. After the conductor 12 is printed, dried and fired, the dielectric layer 14 is printed next to conductor 12 as shown in FIG. 1A, with little or no overlap. During drying, the dielectric layer 14 shrinks to about 50% of its printed thickness as the solvent evaporates, resulting in a dried film of the desired overall thickness, indicated in FIG. 1B as approximately 0.0020 in., or 2 mils. Ideally, this would leave a via opening of approximately the same width as the conductor 12, indicated in FIG. 1A as 8 mils. However, the ideal process is impractical because dielectric layers which are printed thick enough to minimize pin-holing tend to spread significantly beyond the print pattern. In a worst case situation, the dielectric material can completely cover conductor 12, ruining the via.

Figure 2A:
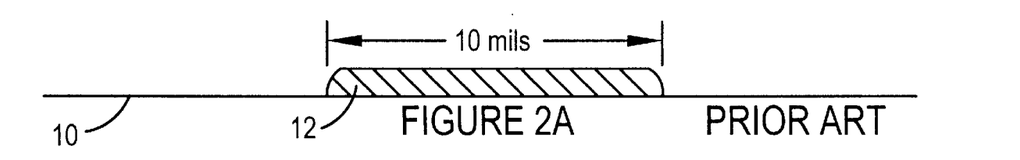
FIGS. 2A–2F depict in cross-section a conventional method of manufacture that accommodates for dielectric spreading in the formation of a via in a thick film circuit.
Figure 2B:
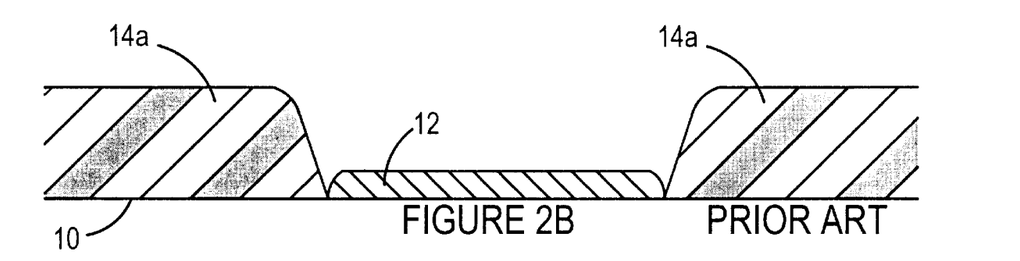
Figure 2C:
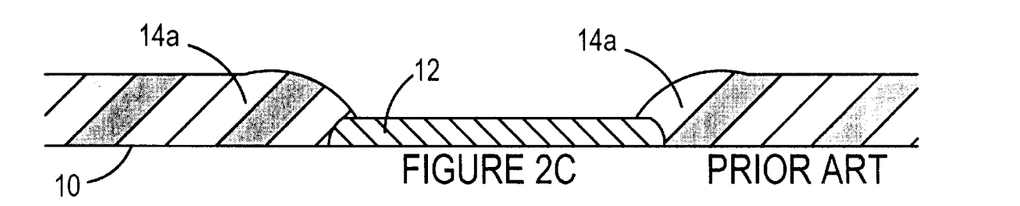
Figure 2D:
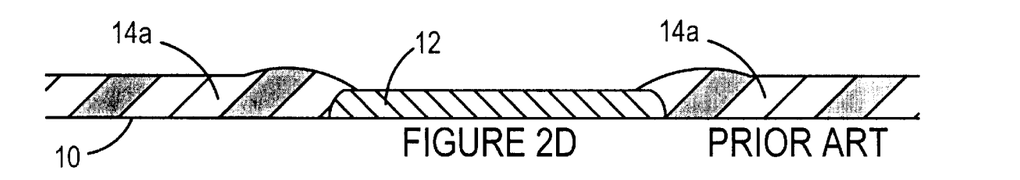
Figure 2E:
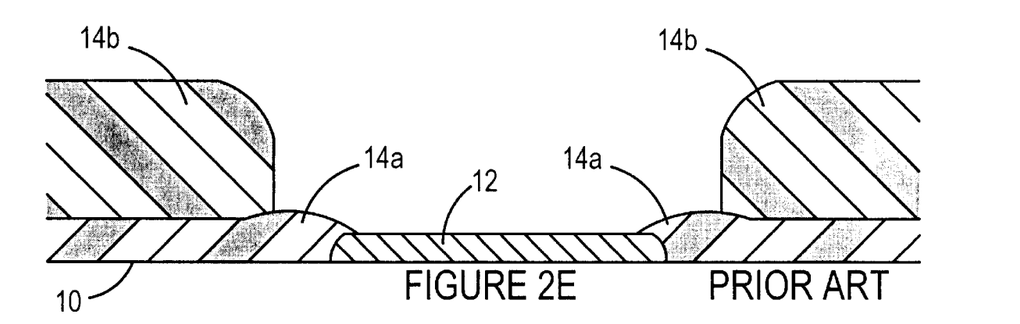
Figure 2F:
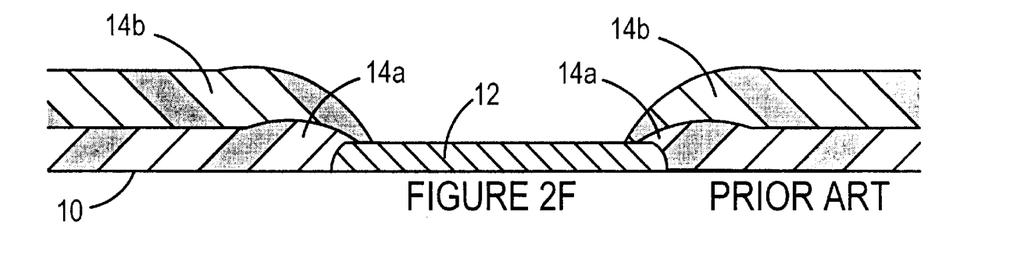

In practical processes, the size of the via is enlarged to accommodate dielectric spreading, and the dielectric layer 14 is formed by two or more thinner dielectric layers. FIGS. 2A–2F illustrate a practical process in which the via is enlarged and the dielectric layer comprises a first layer 14a and a second layer 14b. As seen in FIG. 2B, the print via of the first dielectric layer 14a is enlarged to approximately 10 mils, and the width of the conductor 12 is enlarged in the vicinity of the via to approximately the same dimension. The dielectric layer 14a experiences some spreading prior to and during drying, and is depicted in the dried state in FIG. 2C. As indicated above, the drying process reduces the thickness of the dielectric by approximately 50%, as illustrated. Subsequent firing of the dielectric layer 14a further reduces its thickness by approximately 30%, as depicted in FIG. 2D. As seen in FIG. 2E, the print via of the second dielectric layer 14b is enlarged to approximately 14 mils. The print thickness of dielectric layer 14b is approximately equal to that of layer 14a. Prior to and during drying, the layer 14b spreads somewhat as indicated in FIG. 2F, reducing the width of the completed via to about 6 mils.

Enlarging and staggering the dielectric layers 14a, 14b as shown in FIGS. 2A–2F can effectively accommodate dielectric spreading, but at the expense of taking up additional surface area on upper dielectric layer 14b. Moreover, the width of the vias may need to be increased even further if a third dielectric layer is needed to achieve the desired overall thickness of dielectric. As indicated above, increasing the thickness of the individual dielectric layers to achieve the increased overall thickness only exacerbates the dielectric spreading. Additionally, the amount of dielectric spreading tends to vary with process conditions and material variations, and the feature enlargement must be sufficient to accommodate worst case or near-worst-case conditions.

The above described design approaches illustrate the inherent trade-off between print thickness and feature definition. Thinner dielectric layers provide better feature definition because spreading is reduced, but additional layers and attendant process steps are required to achieve a thick overall dielectric, and pin-holing is more likely. Conversely, thicker dielectric layers achieve a desired overall thickness of dielectric with a minimum number of successive layers, but feature definition suffers due to increased dielectric spreading.

A similar phenomenon is experienced in forming dielectric solder stops, as illustrated in FIGS. 3A–3G. In general, a lateral thick-film conductor 12 formed on the substrate surface 10 is to be soldered to the terminal of an electronic component 20, such as a flip-chip. A solder-stop comprising a layer 24 of dielectric extending laterally across the conductor 12 limits reflow of the solder joint 26 when the component 20 is attached, so as to provide the desired solder connection strength and component stand-off height.

Figure 3A:
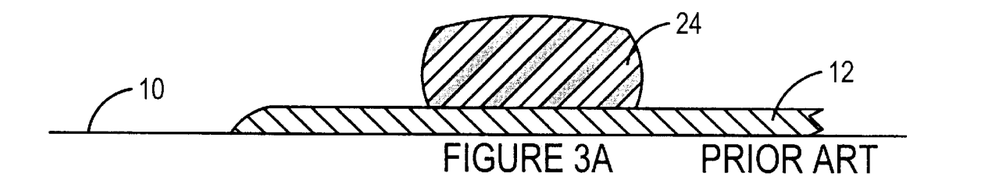
FIGS. 3A–3G depict in cross-section a conventional method of manufacture that accommodates for dielectric spreading in the formation of a solder stop in a thick film circuit.
Figure 3B:
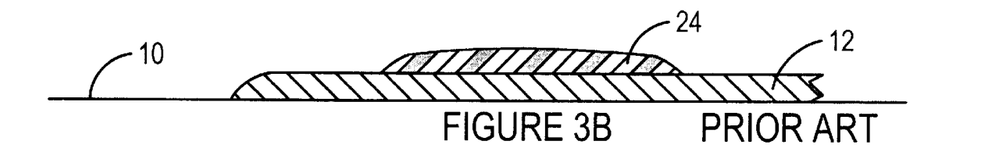
Figure 3C:
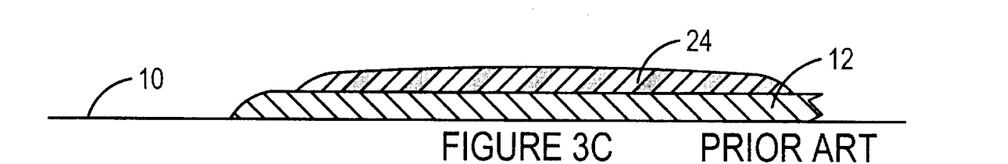
Figure 3D:
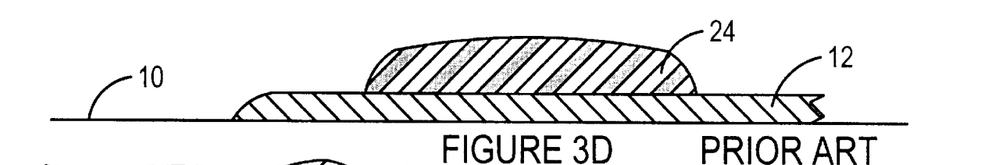
Figure 3E:
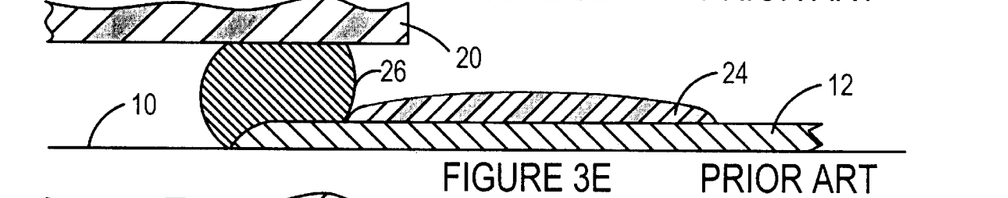
Figure 3F:
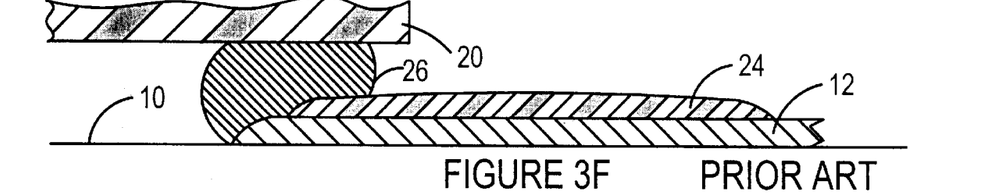
Figure 3G:
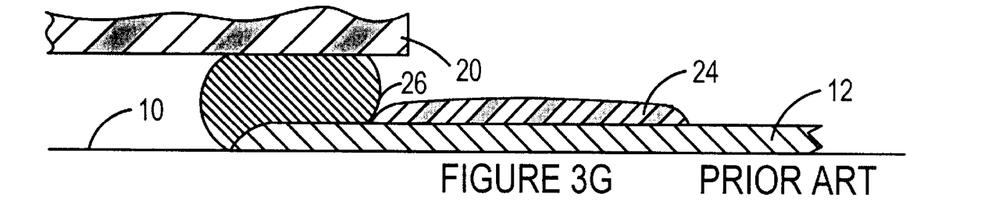

To reduce the number of process steps, the solder-stop layer 24 is typically printed as part of the first dielectric cover layer. Consequently, the solder stop print is relatively thick, as shown in FIG. 3A. Prior to and during drying, the layer 24 spreads out to a variable degree, depending on process and material variations. FIGS. 3B–3D respectively depict nominal spreading, higher than nominal spreading, and lower than nominal spreading. With nominal dielectric spreading, the component 20 is properly soldered to the conductor 12, as illustrated in FIG. 3E; the solder joint 26 has high mechanical strength, and is properly constrained to provide a component stand-off height that facilitates subsequent washing and underfilling processes. With higher then nominal spreading, the exposed area of conductor 12 is too small, and the solder joint 26 is poorly formed, as illustrated in FIG. 3F; the joint 26 in this case makes poor electrical contact and has poor mechanical strength and durability. With lower than nominal spreading, the solder joint spreads out over a large area of conductor 12, as shown in FIG. 3G; in this case, the joint 26 is too thin, and the stand-off height of component 20 is decreased.

The present invention overcomes the above-described disadvantages with an improved method of manufacturing thick film circuits that effectively eliminates the trade-off between dielectric thickness and feature definition. The method of this invention permits the printing of thicker dielectric layers, while at the same time, allowing more precise definition of dielectric features, such as via openings and solder stops. This advance is achieved by utilizing a dielectric material that can be co-fired with the underlying conductor 12.

In general, a layer of the dielectric material, referred to herein as a feature definition layer (FDL), is printed atop the dried but not yet fired conductor material, and then co-fired with the conductor material. Dielectric pastes include a liquid medium and a solid medium; the liquid medium comprises a solvent, resins and surfactants, while the solid medium comprises powdered solids. Due to the porous nature of the dried but not fired conductor material, it absorbs liquid medium from the FDL like a sponge. This reduces the liquid fraction of the paste, thereby increasing the paste viscosity, and inhibiting the spreading of the FDL beyond its original print pattern.

Figure 4A:
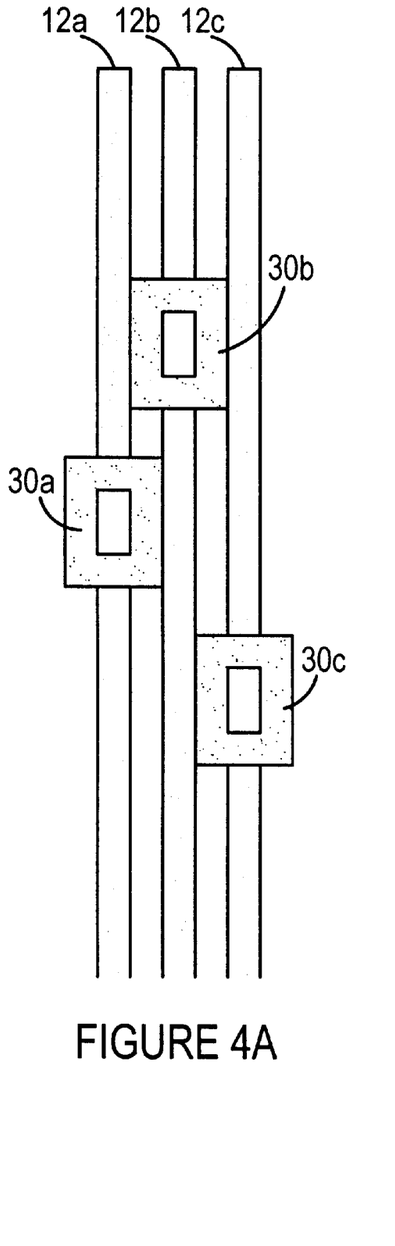
FIGS. 4A–4B depict a first method of manufacture of a via according to this invention in top view.
Figure 4B:
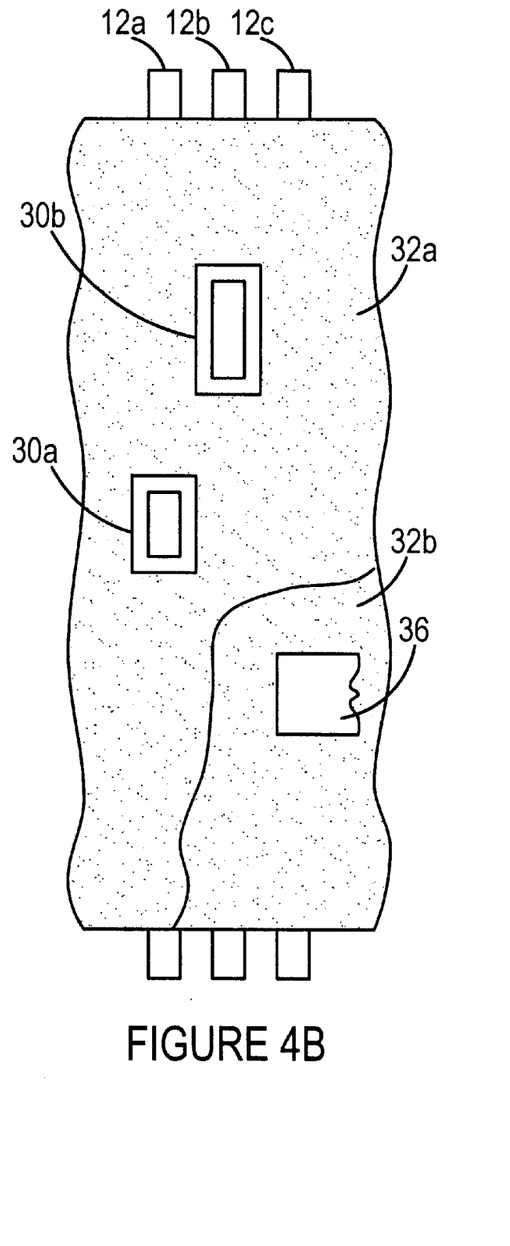

As applied to a via, the FDL is printed atop the dried but unfired conductor 12 in the form of a ring, referred to herein as a via definition ring, or VDR. The VDR defines a dielectric-free region within its center that is in registry with a portion of the conductor 12 which is the intended location of the via. An example of this is illustrated in FIGS. 4A–4B, where VDRs 30*a*–30*c* are printed atop a series of three parallel conductors designated as 12*a*–12*c*. The dielectric material of the VDRs 30*a*–30*c* is free to spread where it is not in contact with conductor material, but spreading is inhibited in areas where it touches conductor material, due to the porosity of the dried but unfired conductor material.

Figure 5A:
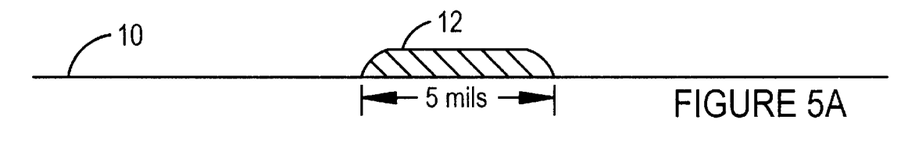
FIGS. 5A–5H depict the method of manufacture of FIG. 4 in cross-section.
Figure 5B:
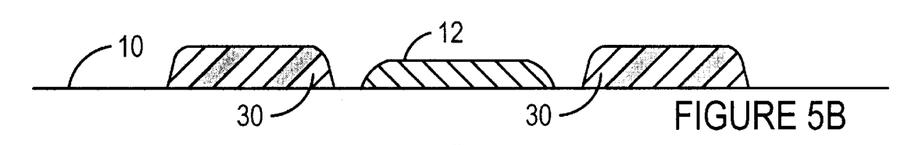
Figure 5C:
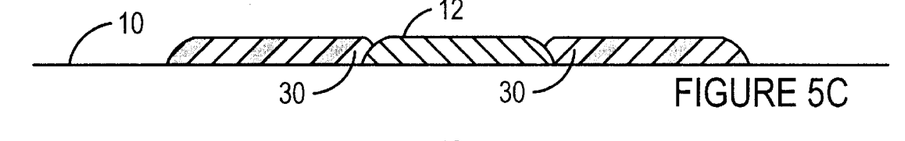

A series of process cross-sections for forming one of the above-described VDRs is depicted in FIGS. 5A–5C. After the conductor 12 is printed and dried (FIG. 5A), the VDR 30 is printed (FIG. 5B) and dried (FIG. 5C) to define a dielectric-free region within the ring 30 in registry with a portion of the conductor 12. As described above, spreading of the VDR 30 after printing and during the drying process is inhibited by the dried but unfired conductor 12, which absorbs solvent from the VDR paste. The VDR 30 and conductor 12 are then co-fired, as illustrated in FIG. 5D.

After co-firing of VDR 30 and conductor 12, the formation of the via is completed by printing, drying and firing each of two cover layers 32*a*, 32*b* of dielectric. To inhibit spreading of the cover layers 32*a*, 32*b* after printing and during drying, the VDR 30 is preferably formulated so that it remains porous after firing.

Figures 5D, 5E:
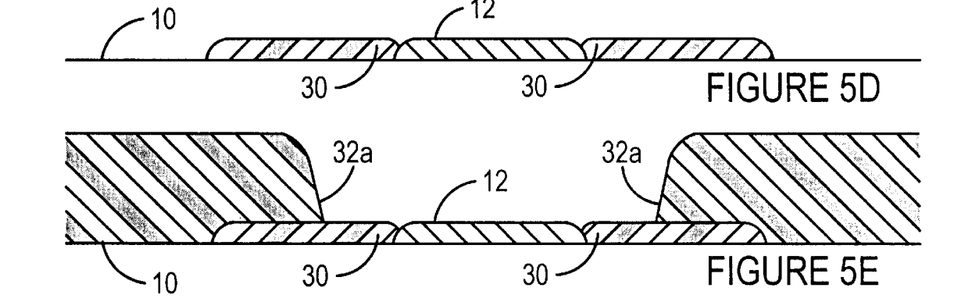
Figure 5F:
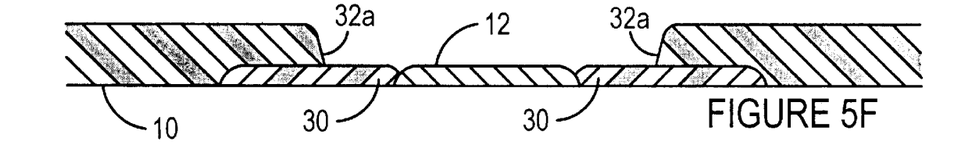

FIGS. 5E and 5F respectively show the first cover layer 32*a* as printed and fired. The cover layer 32*a* is printed to only partially overlap the VDR 30 as shown so that after firing, a portion of VDR 30 is still exposed; this is easy to accomplish even with the illustrated printing thickness since the fired VDR 30 inhibits spreading of the cover layer paste. The drying action of the porous VDR 30 permits the use of a thicker cover layer 32*a* than could be used with prior art manufacturing techniques, as may be seen by comparison with FIGS. 2A–2F. The greater thickness of the dielectric print helps eliminate the formation of pin-holes in the resulting dielectric layer, and minimizes the number of successive dielectric layers needed to achieve the desired overall dielectric thickness.

Figure 5G:
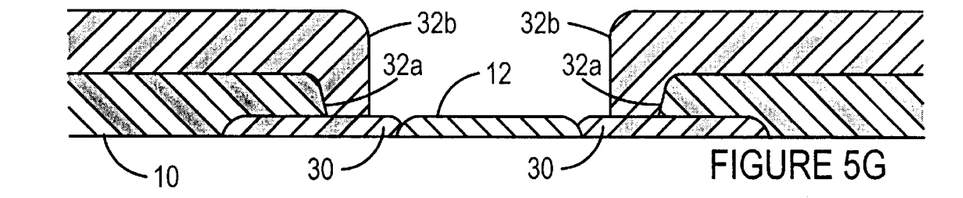
Figure 5H:
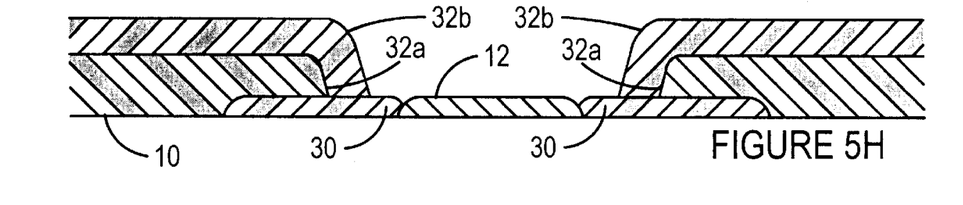

Finally, the second cover layer 32*b* is printed and fired to achieve the desired overall dielectric thickness, as respectively depicted in FIGS. 5G and 5H. The cover layer paste spreads over the fired first cover layer 32*a*, but is inhibited from further spreading when it reaches VDR 30. This leaves the entire area of conductor 12 within VDR 30 exposed, as shown in FIG. 5H, resulting in a via with greatly improved definition compared to previously known processes.

When compared with conventional processes, a circuit manufactured according to the method of this invention has a thicker dielectric, and at the same time, smaller and better defined vias. The thicker dielectric layer provides improved isolation between circuit layers, as discussed above, and the smaller vias increase the available surface area for conductors and components on the upper dielectric layer 32*b*. In a first respect, the definition is improved because the VDR 30 can be precisely printed due to the drying action of the dried but unfired conductor 12; in a second respect, the definition is improved because the cover layers 32*a* and 32*b* can be precisely formed due to the drying action of the fired but porous VDR 30. This allows the overall width of the resulting via to be significantly reduced compared with the process depicted in FIG. 2. Furthermore, the width of the conductor 12 may be reduced as shown in FIG. 6 since the VDR 30 prevents the cover dielectric layers 32*a*, 32*b* from spreading onto the conductor 12.

Figure 6A:
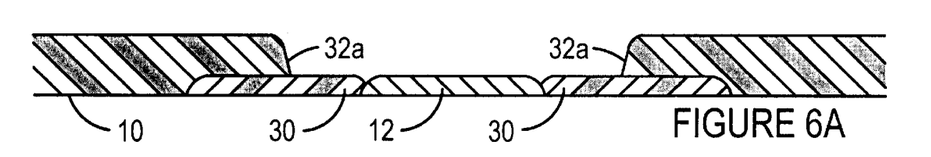
FIGS. 6A–6D depict in cross-section a second method of manufacturing a via in a thick film circuit according to this invention.
Figure 6B:
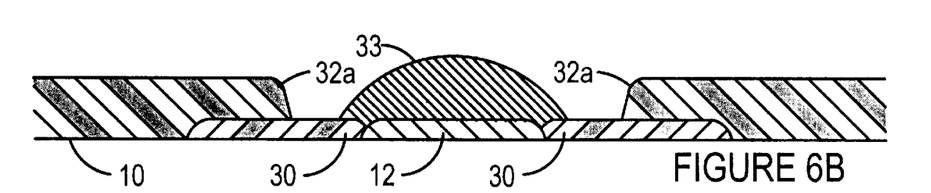
Figure 6C:
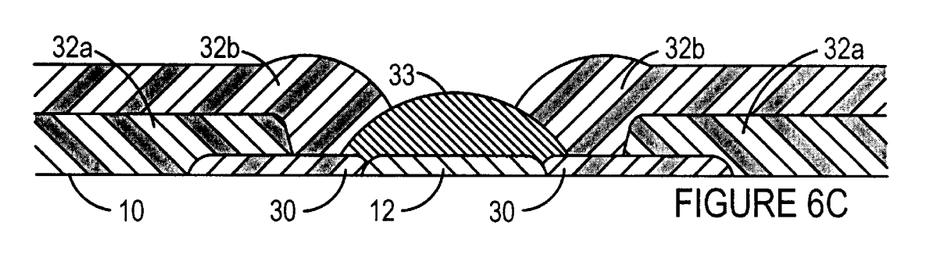
Figure 6D:
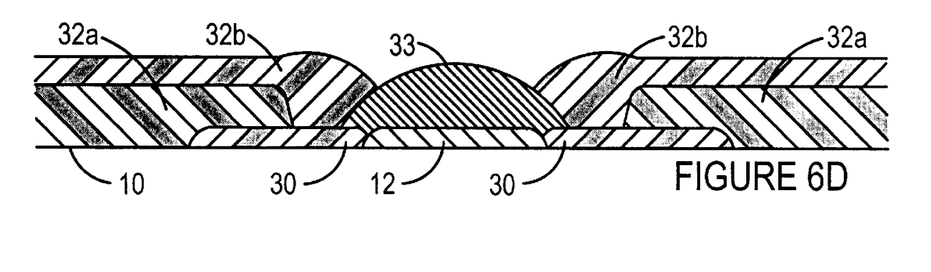

In some applications where a smoother surface topology is desired, a layer of via fill material may be deposited atop the exposed conductor 12 before the printing of the second cover layer dielectric 32*b*. FIGS. 6A–6D depict the latter steps of a preferred method in which the VDR 30 and first cover layer dielectric 32*a* are formed as described above in reference to FIGS. 5A–5F; for convenience, FIG. 5F is repeated as FIG. 6A. After the cover layer 32*a* is fired, a via fill layer 33 is printed atop conductor 12, and dried, as shown in FIG. 6B. Then, the second cover layer 32*b* is printed atop the fired first layer 32*a* and co-fired with the via fill material 33, as seen in FIGS. 6C and 6D, respectively. The cover layer paste 32*b* spreads over the fired first cover layer 32*a*, but is inhibited from further spreading when it reaches the dried but unfired via fill material 33. This leaves the majority of fill material 33 exposed, as shown in FIG. 6D, resulting in a via with greatly improved definition and surface finish compared to previously known processes. Dielectric formulations that may be co-fired with via fill material are commercially available, for example under the product name QM-44 from DuPont Corporation.

As a less desirable alternative to the preferred process of FIG. 6, the via fill material 33 may be fired prior to printing of the second cover layer dielectric 32*b*. In this case, spreading of the cover layer 32*b* is not inhibited by the fired via fill material 33, and other controls (such as print thickness, paste thickness and/or printing location) must be used to ensure that the second dielectric cover layer does not spread excessively. For example, the print via of the second dielectric cover layer 32*b* may be enlarged relative to cover layer 32*a* to accommodate for dielectric spreading.

The purpose of a via, of course, is to provide a connection point between conductors on different circuit layers. Thus, FIG. 4B illustrates a via connection between conductor 12, and a second conductor 36 formed on the dielectric cover layer 32*b*. In the process of FIG. 5, conductor paste for conductor 36 may be deposited directly on conductor 12, or on an intervening layer of via fill material. In the process of FIG. 6, the conductor paste for conductor 36 is deposited atop the fired via fill material 33.

Figure 7A:
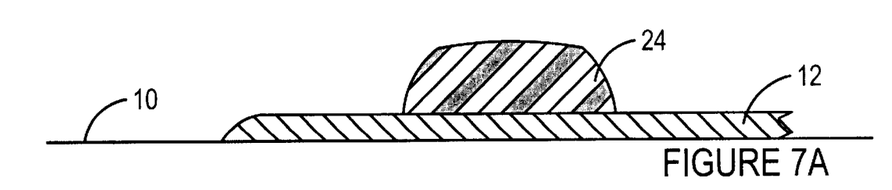
FIGS. 7A–7D depict in cross-section a method of manufacturing a solder stop in a thick film circuit according to this invention.
Figure 7B:
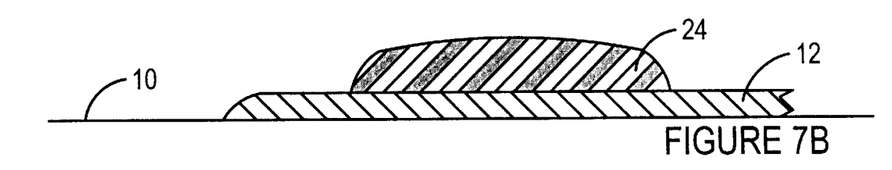
Figure 7C:
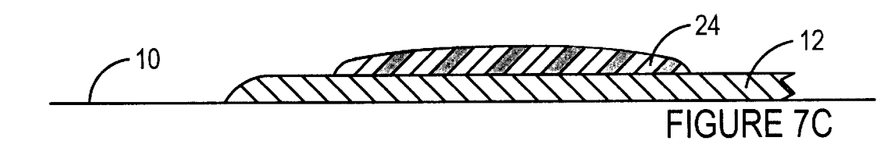
Figure 7D:
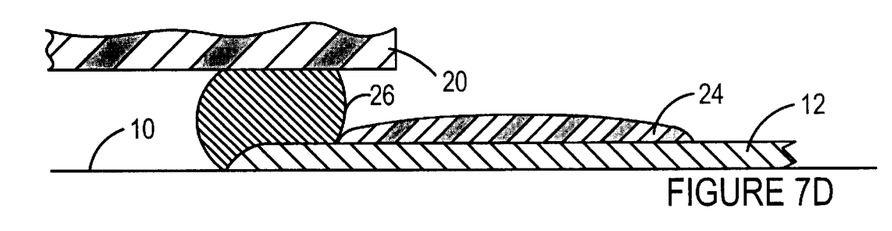

In a second embodiment, the FDL can be printed atop a conductor to form a solder stop with significantly improved feature definition. As with the via, the improved definition occurs because the porous un-fired conductor inhibits spreading of the FDL. Since the solder stops may be precisely controlled, process variability is reduced, and reliability of the final product is increased. FIGS. 7A–7D illustrate the process variability improvement when the FDL is used in the formation of solder-stops 24. After the conductor 12 has been printed and dried, but not yet fired, the FDL 24 is printed and dried, as shown in FIGS. 7A–7B. Spreading of the FDL is inhibited by the dried but not yet fired conductor 12, as described above in respect to the formation of vias. The FDL 24 and the conductor 12 are then co-fired, as shown in FIG. 7C. In the case of solder stops, the improved print definition helps ensure that the solder bumps 26 will be properly sized, increasing reliability of the solder joints and providing the desired component stand-off height to accommodate underfilling, as illustrated in FIG. 7D.

As indicated above, dielectric formulations suitable for the formation of thick film features according to this invention are characterized firstly as being co-firable with the underlying conductor material, and secondly as remaining porous after being fired. The first characteristic is important to the formation of both solder stops and vias because it permits the FDL or VDR to be printed atop a porous surface that limits spreading. The second characteristic is important to the formation of vias because it allows the fired VDR to limit spreading of the subsequently printed dielectric cover layers. In the embodiment of FIGS. 4–5, the VDR limits spreading of both first and second cover layers of dielectric, while in the embodiment of FIG. 6, the dried but unfired via fill material limits spreading of the second cover layer of dielectric.

In general, dielectric paste compositions satisfying these criteria comprise an inorganic filler having a high melting temperature to minimize densification at a firing temperature of 850° C., a glass component selected to permit co-firing, and an organic vehicle to facilitate screen printing. Porosity of the fired dielectric is enhanced by selecting the ratio of inorganic filler to glass such that during firing, the glass bonds the filler particles together without filling in the interstitial areas. Other conventional considerations include filler-to-glass weight ratio, particle size, and dielectric constant.

Of course, it will be understood that various dielectric paste formulations may satisfy the above-described characteristics. Moreover, in certain applications, porosity after firing may not be important, as noted above. Nevertheless, the following table describes one formulation satisfying all of the above-noted considerations and characteristics.

| SOLIDS - 75% By Weight | |
| --- | --- |
| Alumina (AL203) | 83.8% |
| Glass Frit (RRO) | 14.7% |
| Colorant (BG-210) | 2.0% |
| ORGANIC - 25% By Weight | |
| Terpineol | 63.0% |
| Texanol | 20.0% |
| Dodecyl Alcohol | 5.0% |
| DP-9506 | 5.0% |
| Surfactant (Igepal) | 2.0% |
| Binder (N-50 Ethyl Cellulose) | 5.0% |

Fineness of Grind (FOG) - 7.5 microns

In summary, the method of this invention significantly improves the formation of dielectric isolation layers and feature definition in thick-film circuits. The use of a feature definition print that is co-fired with the underlying conductor improves feature definition, and therefore process repeatability. In the formation of vias, the porosity of the fired feature definition layer allows the formation of thicker dielectric cover layers while preserving the via geometry. In both solder stops and vias, the method of this invention contributes to a more robust process that is well suited to high volume manufacturing since there is less fine tuning and batch-to-batch variation. Although described in reference to the illustrated embodiments, it is expected that various modifications will occur to those skilled in the art. For example, the disclosed method can be used on any layer of a multi-layer circuit, and can be applied to features other than vias and solder-stops. Additionally, various formulations other than specifically disclosed herein may be employed, and the process steps may be added or combined in ways well known to those skilled in the art. In this regard, it will be understood that the scope of this invention is not limited to the illustrated embodiments and that methods incorporating such modifications may fall within the scope of this invention, which is defined by the appended claims.

The embodiments of the invention in which an exclusive property or privilege is claimed are defined as follows:

1. A method of manufacturing a circuit, comprising the steps of:

printing and drying a layer of conductor paste to form a dried but un-fired conductor trace;

printing and drying a feature definition layer of dielectric paste that is formulated to be co-firable with said dried conductor paste on a border portion of said conductor trace adjacent an intended connection region of said conductor trace, said dried but un-fired conductor paste inhibiting spreading of said dielectric paste; and co-firing said dielectric paste and said conductor paste.

2. The method of manufacture set forth in claim 1, including the step of soldering an electrical component to the intended connection region of the fired conductor trace, said feature definition layer limiting the solderable area of said intended connection region.

3. The method of manufacture set forth in claim 1, wherein said conductor is part of a first circuit layer, and said dielectric paste is formulated to remain porous after being fired, said method additionally including the steps of:

printing a first cover layer of dielectric paste on said first circuit layer and at least partially overlapping said feature definition layer, said feature definition layer inhibiting spreading of said first cover layer of dielectric material onto said intended connection region of said conductor after printing and during subsequent drying of said first cover layer; and firing said first cover layer.

4. The method of claim 3, including the steps of:

printing a second cover layer of dielectric material atop said first cover layer, said feature definition layer inhibiting spreading of said second cover layer of dielectric material onto said intended connection region of said conductor after printing and during subsequent drying of said second cover layer; and firing said second cover layer.

5. The method of claim 4, including the step of printing a second conductor forming part of a second circuit layer atop said second cover layer of dielectric material, said second conductor intersecting said intended connection region; and forming an electrical connection between said conductors at said intended connection region.

6. The method of claim 3, including the steps of:

printing and drying a layer of via fill material atop the intended connection region of said conductor;

printing a second cover layer of dielectric material atop said first cover layer, the layer of dried via fill material inhibiting spreading of said second cover layer of dielectric material after printing and during subsequent drying of said second cover layer;

co-firing said second cover layer of dielectric material and said via fill material; and printing a second conductor forming part of a second circuit layer atop said second cover layer of dielectric material, said second conductor intersecting the fired layer of via fill material to interconnect said first and second circuit layers.

7. A method of manufacturing a multi-layer circuit, comprising the steps of:

printing and drying a layer of conductor paste to form a first conductor that is dried but un-fired, and that forms a portion of a first circuit layer;

printing and drying a closed via definition ring of dielectric paste that is formulated to be co-firable with said conductor paste of said first circuit layer and to remain porous after being fired, said via definition ring defining a dielectric-free region within said ring in registry with an intended connection region of said first conductor, the dried but un-fired conductor paste inhibiting spreading of said via definition ring;

co-firing said dielectric paste and said conductor paste;

printing, drying and firing a first cover layer of dielectric paste covering said first circuit layer and at least partially overlapping said via definition ring, said via definition ring inhibiting spreading of said first cover layer of dielectric material onto said intended connection region of said first conductor after printing and during subsequent firing of said first cover layer.

8. The method of claim 7, including the steps of:

printing, drying and firing a second cover layer of dielectric material atop said first cover layer, said via definition ring inhibiting spreading of said first cover layer of dielectric material onto said intended connection region of said first conductor after printing and during firing of said second cover layer; and printing a second conductor on said second cover layer of dielectric material, said second conductor intersecting said intended connection region of said first conductor, and forming a portion of a second circuit layer; and forming an electrical connection between said first and second conductors at said intended connection region.

9. The method of claim 7, including the steps of:

printing and drying a layer of via fill material atop the intended connection region of said first conductor;

printing a second cover layer of dielectric material atop said first cover layer, the layer of dried via fill material inhibiting spreading of said second cover layer of dielectric material after printing and during subsequent drying of said second cover layer;

co-firing said second cover layer of dielectric material and said via fill material; and printing a second conductor forming part of a second circuit layer atop said second cover layer of dielectric material, said second conductor intersecting the fired layer of via fill material to interconnect said first and second circuit layers.

* * * * *